United States Patent
Lee (10) Patent No.: US 10,211,624 B2
(45) Date of Patent: Feb. 19, 2019

(54) DRIVE PROTECTION METHOD FOR DIRECT CURRENT MOTOR

(71) Applicant: Wen-Ching Lee, Taichung (TW)

(72) Inventor: Wen-Ching Lee, Taichung (TW)

( * ) Notice: Subject to any disclaimer, the term of this patent is extended or adjusted under 35 U.S.C. 154(b) by 0 days.

(21) Appl. No.: 15/758,167

(22) PCT Filed: Aug. 17, 2016

(86) PCT No.: PCT/CN2016/095688
§ 371 (c)(1),
(2) Date: Mar. 7, 2018

(87) PCT Pub. No.: WO2017/045507
PCT Pub. Date: Mar. 23, 2017

(65) Prior Publication Data
US 2018/0254627 A1    Sep. 6, 2018

(30) Foreign Application Priority Data

Sep. 14, 2015 (CN) .......................... 2015 1 0581424

(51) Int. Cl.
*H02H 7/085* (2006.01)
*H03K 3/023* (2006.01)
*H02P 7/28* (2016.01)

(52) U.S. Cl.
CPC ........... *H02H 7/085* (2013.01); *H02P 7/2805* (2013.01); *H03K 3/023* (2013.01)

(58) Field of Classification Search
CPC ......... H02H 7/085; H02P 7/2805; H02P 1/00; H02P 3/00; H02P 3/023; H02P 6/00; H02P 6/14; H02P 1/26; H02P 1/46; H02P 1/423; H02P 1/18; H02P 6/008; H02P 6/04; H02P 6/08; H02P 6/24; H02P 7/00; H02P 7/29; H02P 7/2913; H02P 7/305; H02P 21/00; H02P 23/00; H02P 25/00; H02P 25/021; H02P 25/08; H02P 25/14; H02P 27/00; H02P 27/04; H02P 27/06; H02P 27/045;
(Continued)

(56) References Cited

U.S. PATENT DOCUMENTS

| 7,432,678 B2 * | 10/2008 | Yokouchi .................. H02P 6/04 318/434 |
| 8,102,133 B2 * | 1/2012 | Yang ....................... H02P 6/085 318/400.01 |
| 2001/0019660 A1 | 9/2001 | Ohno et al. |

FOREIGN PATENT DOCUMENTS

| CN | 101594105 A | 12/2009 |
| CN | 104426135 A | 3/2015 |
| JP | H08182374 A | 7/1996 |

* cited by examiner

*Primary Examiner* — Antony M Paul
(74) *Attorney, Agent, or Firm* — Muncy, Geissler, Olds & Lowe, P.C.

(57) ABSTRACT

A drive protection method used in a drive circuit of a DC motor having a maximum tolerance value is disclosed to include the steps of providing a drive current for driving the DC motor and a control signal a for controlling the output level of the drive current, providing a maximum signal level corresponding to the maximum tolerance value of said DC motor, comparing the level of the feedback signal of the DC motor and the maximum signal level, and computing the feedback signal to obtain an operation signal when the level of the feedback signal exceeds the maximum signal level and then stopping the output of the control signal when the level of the operation signal reaches a turn-off level.

8 Claims, 6 Drawing Sheets

(58) Field of Classification Search
CPC ... H02P 27/08; H02P 3/06; H02P 3/18; G05B 11/28; H03K 3/023
USPC .... 318/400.01, 400.06, 400.07, 400.14, 700, 318/701, 727, 779, 599, 801; 361/22, 23, 361/30, 51, 90, 91.1, 93.9; 388/806, 903, 388/800
See application file for complete search history.

DRIVE PROTECTION METHOD FOR DIRECT CURRENT MOTOR

BACKGROUND OF THE INVENTION

1. Field of the Invention

The present invention relates to motor control and protection technology and more particularly, to a drive protection method for DC motor.

2. Description of the Related Art

Mixers, food processors and juicers all use the power generated by the motor to stir the food materials, which can be fruits, vegetables, rice, flours and chemical powders.

To avoid motor overload damage, it is common to interrupt the operation of the motor in the event of an overload, preventing overload occurrence. For example, if the motor is used for dough making, the mixture of flour and water is initially light-loaded so that the motor can smoothly mix the flour and water. As the mixing time increases, the mixture of flour and water becomes sticky and lumpy, leaving the motor to change from light to heavy duty. As a result, the drive current to the motor also increases so that the overload protection is triggered, and the motor is stopped, however, the dough is usually not finished yet, meaning the dough is not yet usable.

Therefore, how to effectively control the motor to operate normally under heavy load so as to stir the food materials to the ideal state has become an urgent problem in the art.

SUMMARY OF THE INVENTION

The present invention has been accomplished under the circumstances in view. It is therefore the main object of the present invention to provide a drive protection method for direct current (DC) motor, which allows the DC motor to keep working under a heavy load.

To achieve this and other objects of the present invention, a drive protection method is used in a drive circuit of a DC motor. The DC motor has a maximum tolerance value. The drive protection method comprises the steps of: providing a drive current for driving the DC motor and a control signal a for controlling the output level of the drive current; providing a maximum signal level corresponding to the maximum tolerance value of the DC motor; comparing the level of the feedback signal of the DC motor and the maximum signal level; and computing the feedback signal to obtain an operation signal when the level of the feedback signal exceeds the maximum signal level and then stopping the output of the control signal when the level of the operation signal reaches a turn-off level.

Other advantages and features of the present invention will be fully understood by reference to the following specification in conjunction with the accompanying drawings, in which like reference signs denote like components of structure.

DETAILED DESCRIPTION OF THE INVENTION

Figure 1:
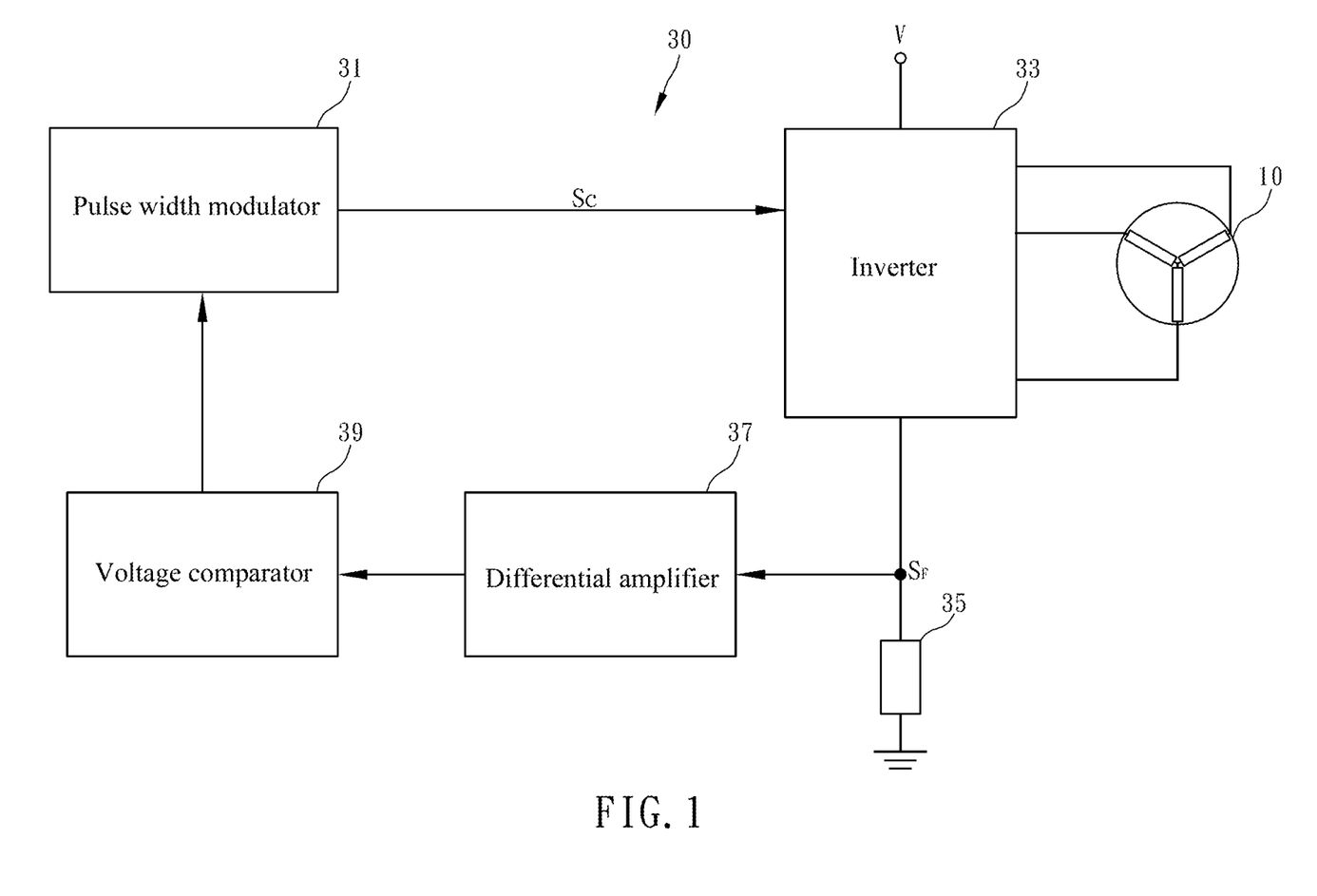
FIG. 1 is a circuit block diagram of a DC motor and a drive circuit in accordance with the present invention.

FIG. 1 is a circuit block diagram of a DC motor 10 and a drive circuit 30 of the DC motor 10. The DC motor 10 can be a brushless DC motor or brushed DC motor. The DC motor 10 has a maximum tolerance value. The maximum tolerance value is the maximum value within which the DC motor 10 can operate normally without causing damage. The maximum tolerance value usually refers but is not limited to current.

In this embodiment, the DC motor 10 has installed therein 3 hall sensors (not shown) respectively adapted for sensing a respective magnetic field polarity signal in a respective installation position for DC motor speed control.

The drive circuit 30 is adapted for receiving the magnetic field polarity signals from the hall sensors for computing the actual speed of the DC motor. It is well-known in the art to calculate the rotational speed in this way and will not be repeated here. The drive circuit 30 comprises a pulse width modulator 31, an inverter 33, a signal detector 35, a differential amplifier 37 and a voltage comparator 39.

The pulse width modulator 31 is electrically coupled to the inverter 33, and adapted for generating a control signal Sc. The control signal $S_C$ has multiple duty cycles. Each duty cycle has a duty ratio. In practice, the pulse width modulator 31 can be implemented by a circuit composed of an active device and a passive device, or by a microprocessor and an integrated circuit. Therefore, the pulse width modulator 31 is not limited to a configured form.

The inverter 33 is electrically coupled to the DC motor 10 and a main power supply V. The main power supply V provides electricity to the inverter 33. The control signal $S_C$ controls the inverter 33 to change an output level of a driving current outputted from the inverter 33. The range of the output level is between 0 and maximum tolerance value of the DC motor 10.

Further, the inverter 33 can be in the form of a half-bridge, full-bridge or three-phase circuit. No matter what type of circuit, the inverter 33 includes a circuit composed of multiple power transistors. The power transistors have an instantaneous overcurrent withstand value that is greater than the maximum tolerance value of the DC motor 10.

The signal detector 35 is electrically coupled to the inverter 33. The driving current passes through the signal detector 35. In this embodiment, the signal detector 35 is a resistor. Therefore, the signal detector 35 generates a voltage signal subject to the Ohm's law, that is, the signal detector 35 detects a feedback signal $S_F$ provided by the DC motor 10. In actual application, the signal detector 35 can also use other components, circuits or ways to achieve feedback signal detection, rather than the user of a resistance.

The differential amplifier 37 is electrically coupled to the inverter 33 and the signal detector 35. Since the signal detector 35 detects the feedback signal $S_F$ and the feedback signal $S_F$ is a weak voltage signal, the differential amplifier 37 can be used to amplify the feedback signal Sr.

The voltage comparator 39 is electrically coupled to the differential amplifier 37 and the pulse width modulator 31 and adapted for receiving the amplified feedback signal $S_F$ from the differential amplifier 37 and then comparing the level of the feedback signal $S_F$ with a maximum signal level corresponding to the maximum tolerance value of the DC motor 10. The voltage comparator 39 comprises an integral unit, which is triggered when the driving current is equal to or greater than the maximum tolerance value and integrates the feedback signal to obtain an operation signal. The voltage comparator 39 determines whether the integrated feedback signal exceeds a turn-off level and controls the pulse-width modulator 31 to stop outputting the control signal when the integrated feedback signal exceeds the turn-off level, that is, to stop from providing current to the DC motor 10. Thus, the drive circuit 30 can effectively control the operation of the DC motor 10. Further, the turn-off level is higher than the maximum signal level. The drive protection method of the DC motor 10 is described hereinafter.

Figure 2:
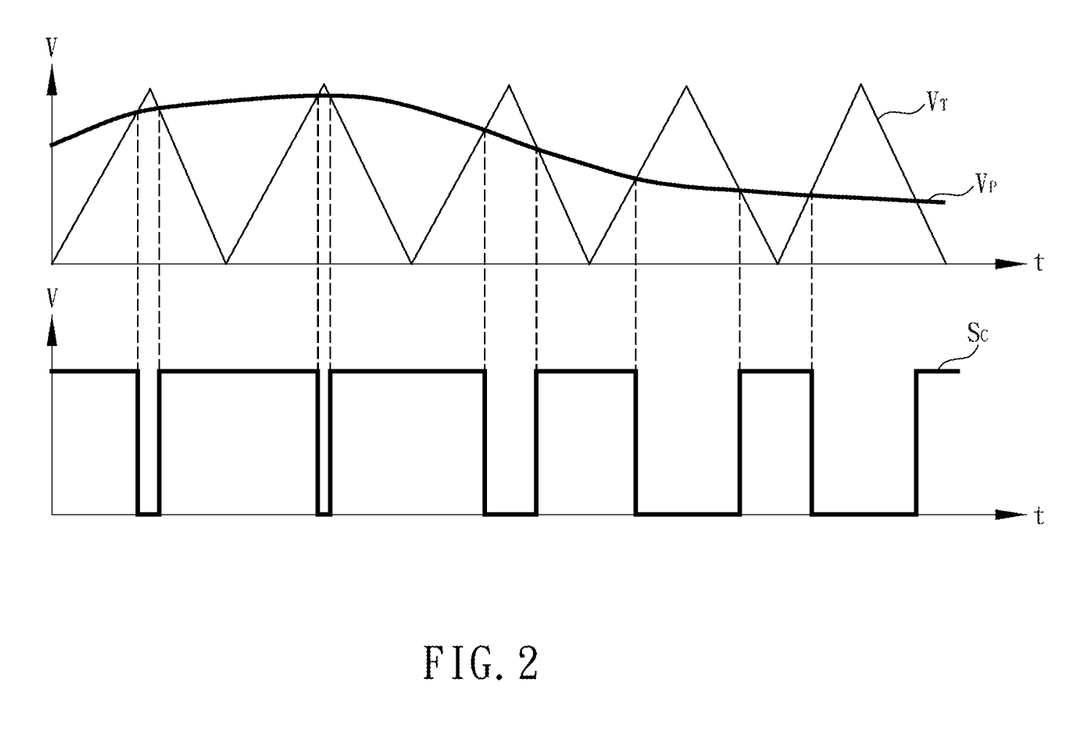
FIG. 2 is a signal diagram of a control signal, a tooth wave signal and a phase voltage in pulse width modulation.

Referring to FIG. 2, the pulse width modulation technique is to compare the level of the phase voltage $V_P$ of the DC motor with the saw tooth wave signal $V_T$ of a fixed frequency and amplitude to generate the foregoing control signal $S_C$. The level of the phase voltage $V_P$ changes with the speed of the DC motor. In other words, the speed control of the DC motor can be achieved by adjusting the duty ratio of the duty cycle of the control signal $S_C$ outputted by the pulse width modulator 31. Further, the phase voltage $V_P$ of the DC motor is obtained from the reduction of the control signal $S_C$.

Figure 3:
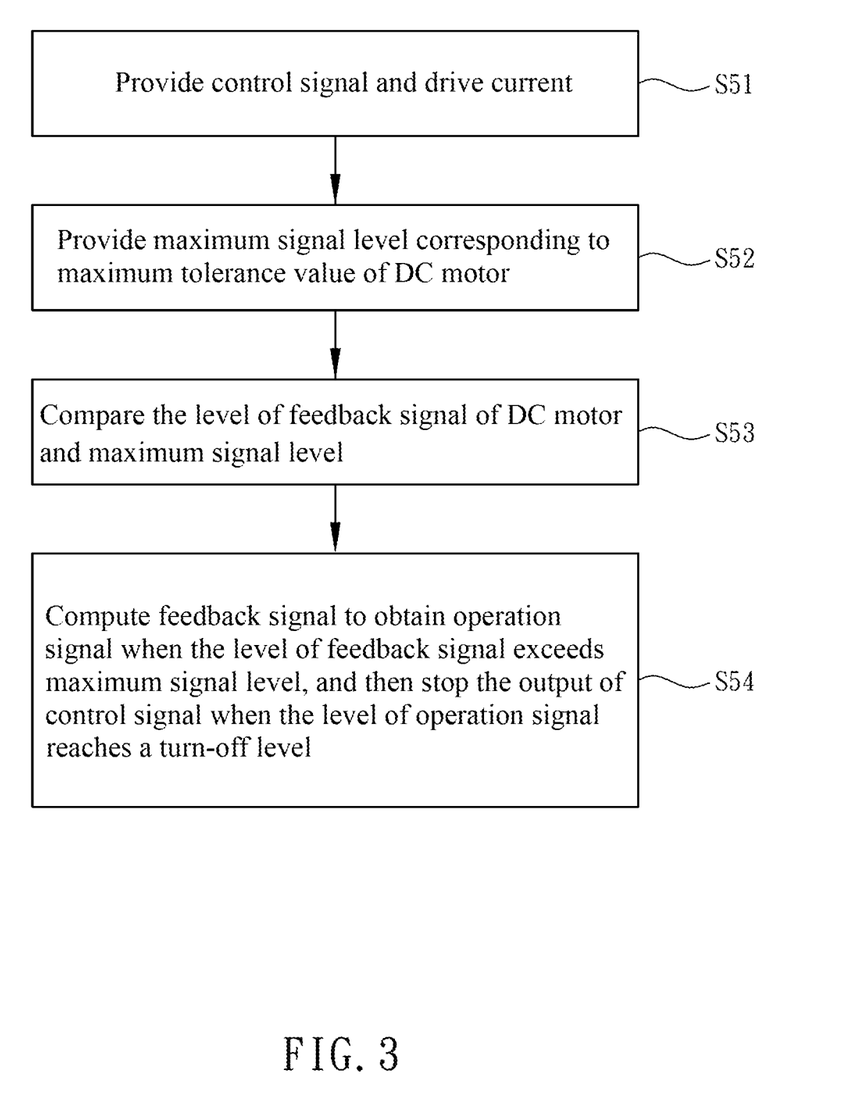
FIG. 3 is a flow chart of the drive protection method of the present invention.

Since the present invention has the above-mentioned hardware composition, the present invention enables the DC motor to exert its optimum operational performance by means of activating the drive protection method during actual operation. As illustrated in FIG. 3, the drive protection method comprises the steps described hereinafter.

First, step S51: provide a control signal and a drive current where the control signal is used to control the output level of the drive current; the drive current is used to drive the DC motor.

Next, step S52: provide a maximum signal level corresponding to the maximum tolerance value of the DC motor.

Then, step S53: compare the level of the feedback signal of the DC motor and the maximum signal level.

Afterwards, step S54: compute the feedback signal to obtain an operation signal when the level of the feedback signal exceeds the maximum signal level, and then stop the output of the control signal when the level of the operation signal reaches a turn-off level.

Steps S53 to S54 may be defined as overload protection to prevent damage to the DC motor due to prolonged overload operation. The order of steps S51 and S52 can be reversed, or steps S51 and S52 can be kept in the same order, and therefore, they are not limited to those described in this embodiment.

Figure 4:
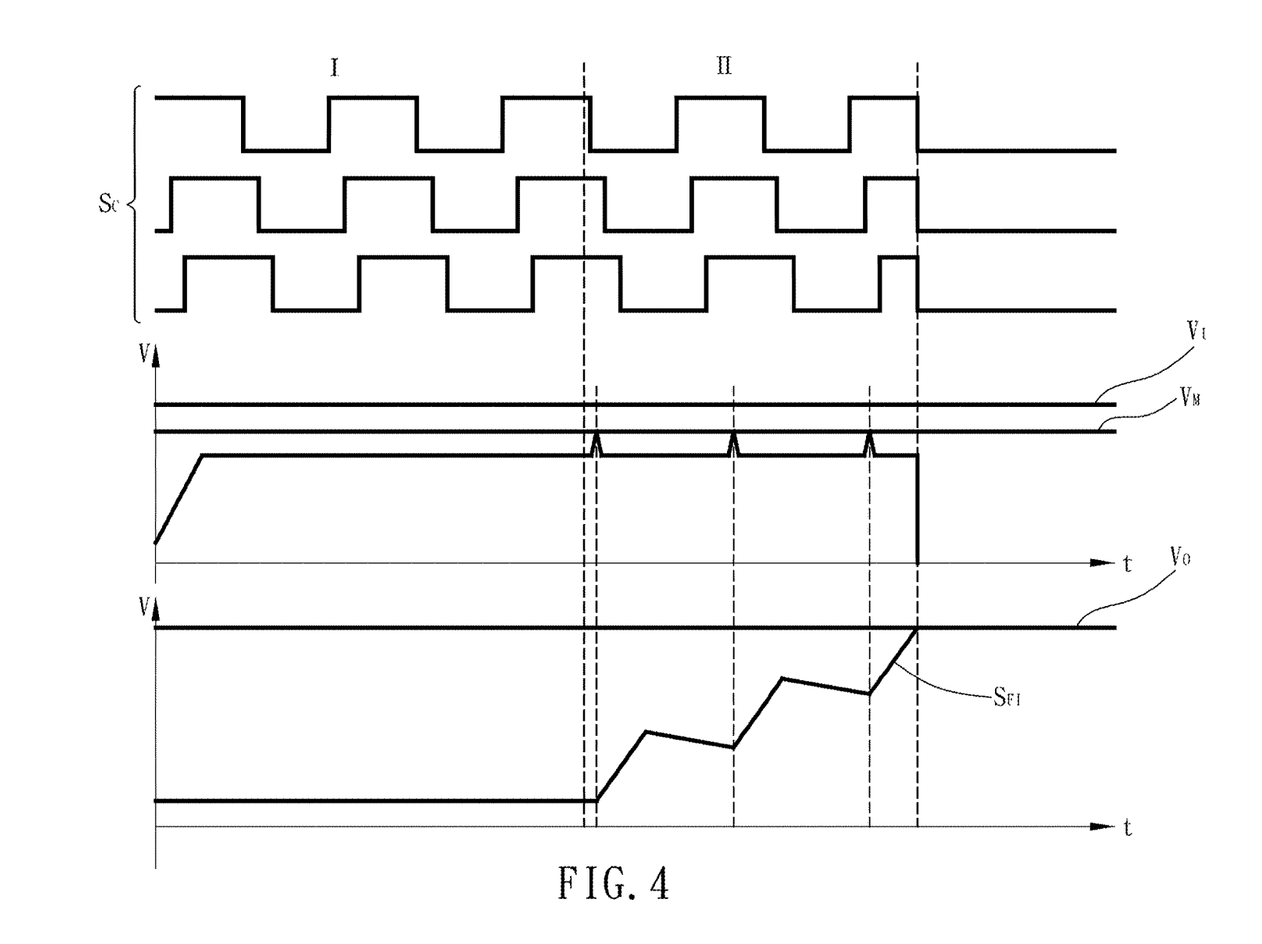
FIG. 4 is a signal diagram of the drive protection method of the present invention, illustrating the level of the feedback signal exceeded the maximum signal level and the control signal outputted.

FIG. 4 shows the characteristic curve of the control signal Sc, feedback signal $S_F$ and operation signal $S_{FT}$ of a three-phase system. In normal operation, such as zone I, the level of the feedback signal $S_F$ is not greater than or equal to the maximum signal level $V_M$, that is, when the level of the drive current of the DC motor does not reach its maximum tolerance value, the speed of the DC motor can be adjusted by means of adjusting the duty ratio of the duty cycle of the control signal Sc, that is, when the drive current is less than the maximum tolerance value, the speed of the DC motor can be controlled by adjusting the duty ratio of the duty cycle. At this time, the integral unit of the voltage comparator will not be triggered and operated, that is, step S54 is not operating.

When the DC motor reaches the heavy load situation, as shown in zone II of FIG. 4, the level of the feedback signal $S_F$ exceeds the maximum, signal level $V_M$. At this moment, step S54 is triggered and operated, and the feedback signal $S_F$ is started to obtain the operation signal $S_{FT}$. When the operation signal $S_{FT}$ reaches the turn-off level $V_O$, the output of the control signal $S_C$ is stopped, that is, the supply of the drive current to the DC motor is stopped, avoiding DC motor overload damage.

It can be seen from FIG. 4 zone II that the feedback signal $S_F$ exceeds the maximum signal level $V_M$, three times. Therefore, the calculation of the feedback signal $S_F$ in step S54 is performed in an integral manner. In this way, the feedback signal $S_F$ that is generated in different duty cycles and that exceeds the maximum signal level $V_M$ can be continuously traced to avoid DC motor damage During operation of the feedback signal $S_F$, the drive current traces the maximum tolerated value, so that the DC motor maintains a low speed and a high torque output. The drive current tracing the maximum current value means that the drive current is less than or equal to the maximum tolerance value.

Further, when the level of the feedback signal $S_F$ exceeds the maximum signal level $V_M$ (i.e., overload), the integral unit is triggered, and the feedback signal $S_F$ exceeding the maximum signal level $V_M$ is integrated.

During integration, the more the level of the feedback signal $S_F$ exceeds the maximum signal level $V_M$, the steeper the rising slope of the operation signal $S_{FT}$ will be, that is, the faster to reach the judgment condition of turn-off level $V_O$.

In this way, the drive current does not last for a long time and continuously exceeds the maximum tolerance value of the DC motor, that is, under heavy load conditions, the drive current is less than or equal to the maximum tolerance value to protect the lifespan of the DC motor during heavy load operation, and to avoid DC motor damage.

When the level of the feedback signal $S_F$ exceeds the maximum signal level $V_M$, the speed of the DC motor is kept constant while the control signal $S_C$ is used to control the drive current. In other words, the DC motor maintains a fixed speed (usually low speed) during heavy loads and controls the drive current to trace the maximum tolerance value so that the DC motor can operate normally under heavy loads.

Compared with the prior art, when overloaded, the drive protection method of the present invention can effectively prevent the drive current from exceeding the maximum tolerance value of the DC motor for a long time and can maintain the output of low speed and high torque so that the mixing food can be stirred more effectively.

Figure 5:
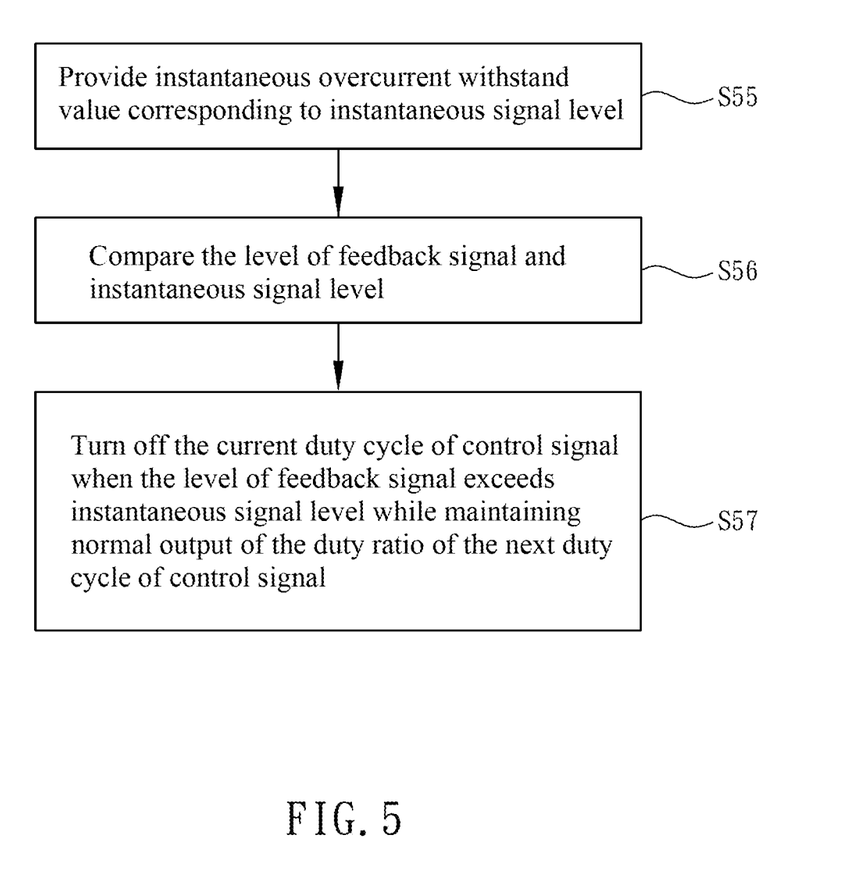
FIG. 5 is another flow chart of the drive protection method of the present invention.

Referring to FIG. 5, as described above, the power transistors have an instantaneous overcurrent withstand value that is greater than the maximum tolerance value of the DC motor 10. The drive protection method further comprises the steps of:

Step S55: provide an instantaneous overcurrent withstand value corresponding to an instantaneous signal level.

Step S56: compare the level of the feedback signal and the instantaneous signal level.

Step S57: turn off the current duty cycle of the control signal when the level of the feedback signal exceeds the instantaneous signal level while maintaining normal output of the duty ratio of the next duty cycle of the control signal.

Steps S55~S57 can be defined as over-current protection to protect the drive circuit power transistors. In step S57 turning off the current duty cycle of the control signal means that the duty ratio of the current duty cycle is promptly returned to 0 to turn off the current on-cycle, rather than indicating that the duty ratio of the current duty cycle is equal to zero. Maintaining normal output of the duty ratio of the next duty cycle of the control signal means that the turn-on rate of the duty cycle of the signal is not forcibly turned off but operates at a normal rate.

Figure 6:
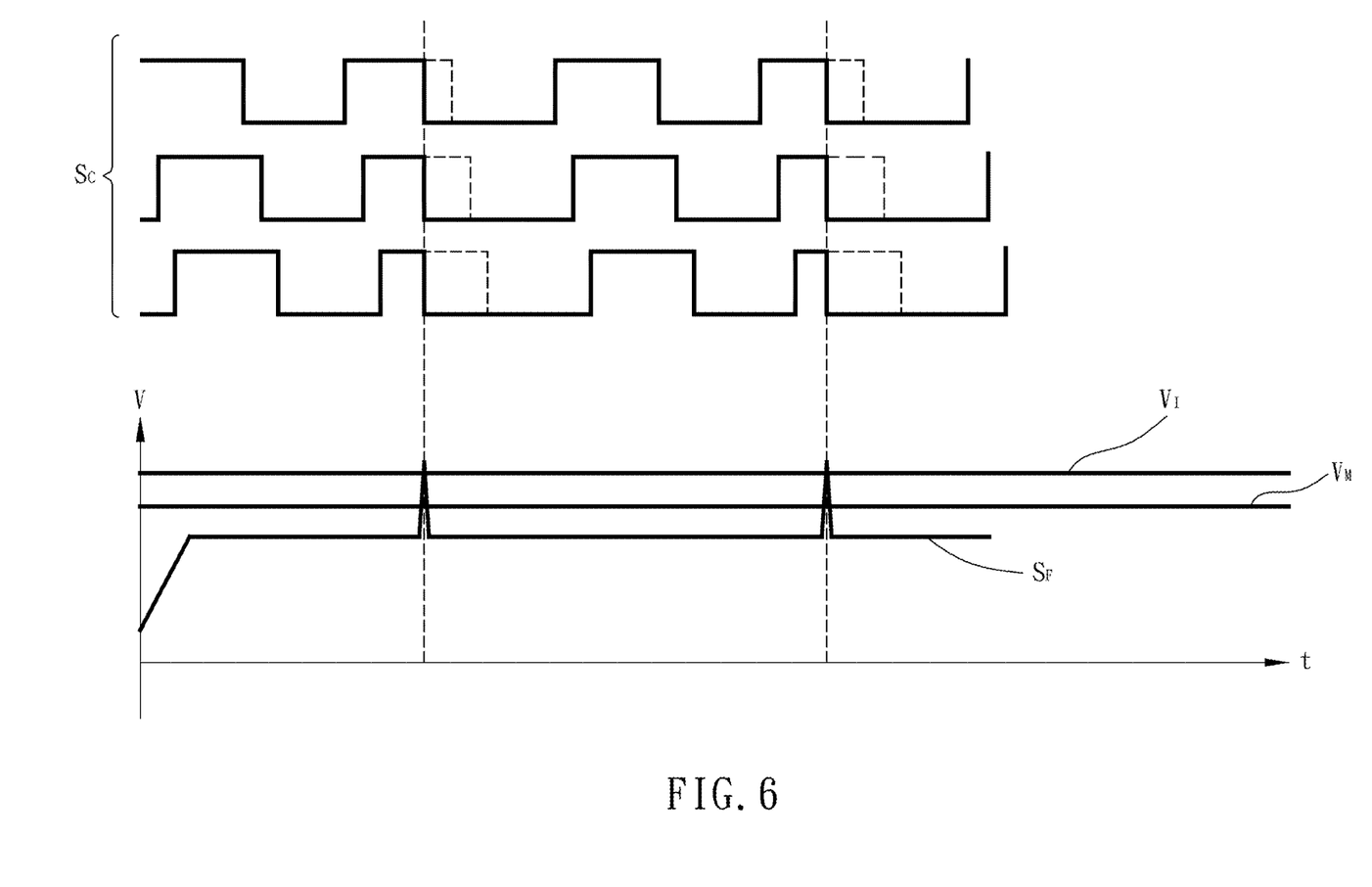
FIG. 6 is a signal diagram of the drive protection method of the present invention, illustrating the level of the feedback signal exceeded the instantaneous signal level and the control signal outputted.

As shown in FIG. 6, when the level of the feedback signal $S_F$ exceeds the instantaneous signal level $V_I$ for the first time, as shown on the left in the figure, it means that the drive current has exceeded the load of the power transistor. Therefore, the drive protection method of the present invention is to directly turn off the conduction ratio of the three-phase control signal $S_C$ for the duty cycle, that is, let the duty ratio of the current duty cycle of the three-phase control signal $S_C$ be equal to 0 (the dotted line of the control signal shown in the drawing is used to indicate the three-phase control signal $S_C$ is closed, so in practice, the dotted line does not exist). Thus, the transmission path of the drive current is turned off. When entered the next duty cycle, the duty ratio works normally unless the level of the feedback signal $S_F$ the instantaneous signal level $V_I$ in the next duty cycle (as shown on the right in the drawing). When this condition occurs, repeat step S56. Therefore, if the level of the feedback signal $S_F$ exceeds the instantaneous signal level $V_I$, the drive protection method of the present invention will not directly stop the DC motor operation but will turn off the duty cycle of the current control signal to avoid the false overload.

For pseudo overload, for example, when the DC motor is stirring the dough, the level of the feedback signal $S_F$ exceeds the level of the instantaneous signal level $V_I$ due to that the tool cannot rotate the dough, at this time, turn off the current duty cycle can avoid DC motor damage. When the output of the duty cycle of the control signal returns normal, the dough can then be rotated by the tool, allowing the DC motor to continuously stir the dough.

It is to be noted that when the level of the feedback signal $S_F$ exceeds the instantaneous signal level $V_I$, it means the level of the feedback signal $S_F$ also exceeds the maximum signal level $V_M$, thus, the integral unit is also triggered.

In addition, the drive protection method of the present invention also has a short-circuit protection. The short-circuit protection is that when there is an abnormal increase in the drive current, the drive circuit directly interrupts the drive current output to the path of the DC motor to protect the DC motor.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A drive protection method used in a drive circuit of a DC motor, said DC motor having a maximum tolerance value, the drive protection method comprising the steps of:
    providing a control signal and a drive current, said control signal being adapted for controlling the output level of said drive current, said drive current being adapted for driving said DC motor;
    providing a maximum signal level corresponding to said maximum tolerance value of said DC motor;
    comparing a level of a feedback signal of said DC motor and said maximum signal level; and
    computing said feedback signal to obtain an operation signal and said drive current traces said maximum tolerance value when the level of said feedback signal exceeds said maximum signal level, and then stopping the output of said control signal when a level of said operation signal reaches a turn-off level.

2. The drive protection method as claimed in claim 1, wherein said computing said feedback signal comprises using integral operation.

3. The drive protection method as claimed in claim 1, wherein said drive current traces said maximum tolerance value to check whether said drive current is smaller than or equal to said maximum tolerance value.

4. The drive protection method as claimed in claim 1, wherein when said drive current traces said maximum tolerance value, the speed of said DC motor is maintained constant.

5. The drive protection method as claimed in claim 1, wherein when the level of said feedback signal is smaller than or equal to said maximum signal level, said control signal controls a rotation speed of said DC motor.

6. The drive protection method as claimed in claim 5, wherein when the level of said feedback signal is smaller than or equal to said maximum signal level, said drive current is equal to or smaller than said maximum tolerance value.

7. The drive protection method as claimed in claim 1, wherein said drive circuit has an instantaneous overcurrent withstand value greater than said maximum tolerance value; said control signal comprises plurality of duty cycles; the drive protection method further comprises the steps of:
    providing an instantaneous signal level corresponding to said instantaneous overcurrent withstand value; and
    comparing the level of said feedback signal and said instantaneous signal level and turning off the current duty cycle of said control signal when the level of said feedback signal exceeds said instantaneous signal level while maintaining normal output of the duty ratio of the next duty cycle of said control signal.

8. The drive protection method as claimed in claim 1, wherein a range of the output level of said drive current is between 0 and said maximum tolerance value.

\* \* \* \* \*